United States Patent [19]

Bobeck et al.

[11] 4,056,812
[45] Nov. 1, 1977

[54] FAULT TOLERANT MAGNETIC BUBBLE MEMORY

[75] Inventors: Andrew Henry Bobeck, Chatham; Robert Frederick Fischer, Livingston, both of N.J.

[73] Assignee: Bell Telephone Laboratories, Incorporated, Murray Hill, N.J.

[21] Appl. No.: 683,736

[22] Filed: May 6, 1976

[51] Int. Cl.² ............................................. G11C 19/08
[52] U.S. Cl. ....................................... 365/17; 365/17; 365/11; 365/43; 365/39
[58] Field of Search ................................. 340/174 TF

[56] References Cited

U.S. PATENT DOCUMENTS 3,821,725   6/1974   Kita et al. ...................... 340/174 TF

OTHER PUBLICATIONS

IBM Technical Disclosure Bulletin - vol. 16, No. 9, Feb. 1974, pp. 2973–2975.
American Institute of Physics Conference Proceedings, No. 29, Dec. 9–12, 1975, pp. 51–53.

*Primary Examiner*—James W. Moffitt
*Attorney, Agent, or Firm*—Herbert M. Shapiro

[57] ABSTRACT

A field-access, magnetic bubble memory organized in a major-minor configuration includes an extra set of minor loops dedicated to fault correction. The loops of the extra set are coupled to a major path in a manner to move the information in the loops of the set controllably out of synchronism with respect to the information in the remaining loops. Thus, information in the loops of the extra set can be inserted into the data stream originating from the remaining loops at positions of missing data from faulty ones of those loops.

16 Claims, 5 Drawing Figures

FAULT TOLERANT MAGNETIC BUBBLE MEMORY

BACKGROUND OF THE INVENTION

1. Field of the Invention

This invention relates to magnetic bubble memories and more particularly, to such memories adapted for fault handling.

2. Description of the Prior Art

Magnetic bubble memories are now well known in the art. A particularly familiar organization for bubble memories is disclosed in P. I. Bonyhard, U.S. Pat. No. 3,618,054 issued Nov. 2, 1971. That patent describes the "major-minor" organization for a field-access bubble memory. The term "field-access" refers to a memory wherein bubble propagation paths are defined by a pattern of elements typically of high permeability permalloy. The elements are designed to respond to a magnetic field reorienting in the plane of bubble movement to move domains to a detector. Since bubble movement occurs in response to periodic changes in a magnetic field and since sequential access of data represented by bubble patterns occurs in response to those changes, the arrangement is referred to as a "field-access" arrangement.

In major-minor organizations, the bubble paths are defined as closed loops, operative in parallel, for recirculating bubble patterns. An accessing path to which information is moved from the minor loops is operative synchronously to move bubble patterns to a detector. The accessing path is disposed close to one end of the minor loops and is called the major path. This major path, or a similar major path close to the opposite ends of the minor loops, is adapted for a write operation in which information, generated therein at a generator, is advanced into positions for movement to the minor loops.

It has been found that during manufacture, magnetic bubble memories are characterized by a yield which is substantially limited by the fact that a small number of minor loops exhibit diminished operating margins and/or defects, such as an impaired element, which preclude or limit operation. Of course, the presence of normally unused minor loops which could be substituted for such defective loops would improve yields substantially. But, some means for ensuring proper organization of the data stream from an impaired set of minor loops plus a replacement loop must be provided because the replacement loop cannot be located physically on the chip for proper placement of the data bit from that loop.

In prior art bubble fault-handling schemes, the proper placement of data from a replacement loop with respect to the data stream required significant circuitry external to the bubble memory. Thus, for example, prior art schemes for fault-handling typically employ a read-only memory (ROM) in which data recording the positions of faulty loops are stored. The output of the ROM is used to first strip the data stream of the bits to be stored in the auxiliary memory and second, to provide the needed control to reconstruct the data stream.

BRIEF DESCRIPTION OF THE INVENTION

The present invention is directed at a magnetic bubble memory fault-handling arrangement in which the proper placement of data from replacement loops is handled within the bubble memory organization with little external circuitry. To this end, the minor loops of a major-minor bubble memory are organized into two sets. One of the sets is relatively large and constitutes the main storage area. The other set comprises auxiliary loops, ones of which are adapted for replacement of inoperative or partially operative loops from the main storage area.

The set of auxiliary loops is placed with respect to a major path so that data therefrom arrive at a bubble detector normally prior to the arrival of data from defective loops of the main storage area. The movement of data from the auxiliary loops into the major path is implemented by means of an idle register in which data is selectively stalled as the in-plane field reorients. In this manner, the positions of the stalled data are changed with respect to that from the main storage area and the stalled data can be inserted into the data stream, to correct for faults, during the movement of that data to the detector in a read operation.

Similarly, a selected bit may be withdrawn from an incoming data stream during a write operation. The withdrawn bit is stalled at the ports to the auxiliary loops for storage in a slot corresponding to that of a faulty loop of the main storage area into which the remaining data are stored. Provision is made for stalling more than one bit in a data stream by an idle register which is operative to advance preceding replacement data in the register to positions which permit storage of subsequent replacement data.

BRIEF DESCRIPTION OF THE INVENTION

FIGS. 1, 2, 3, 4, and 5 are schematic representations of portions of magnetic bubble memories in accordance with this invention.

DETAILED DESCRIPTION

Figure 1:
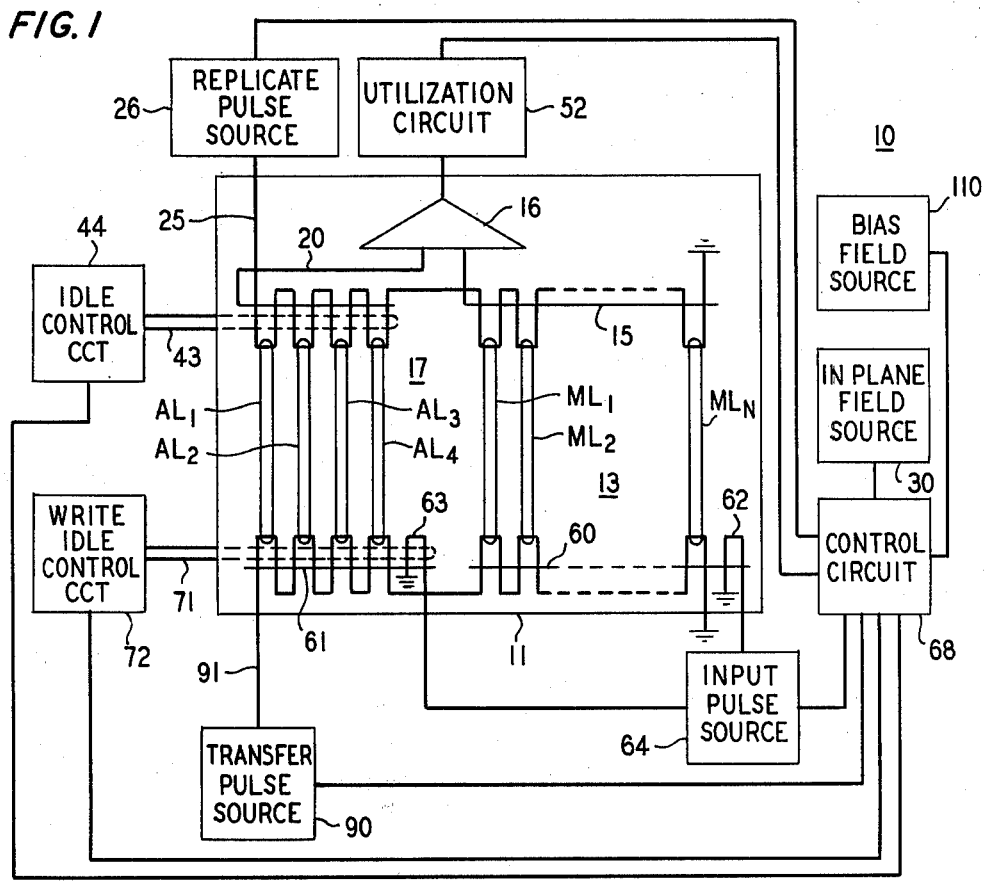

FIG. 1 shows a magnetic bubble memory 10 organized for fault-handling in accordance with one embodiment of this invention. The memory comprises a layer 11 of magnetic material in which magnetic bubbles can be moved. A pattern of magnetic elements overlying layer 11 defines a plurality of paths for the movement of bubbles in the layer.

The organization of the magnetic elements is such as to define two sets of minor loops and a pair of major paths for each of those sets in the illustrative memory. One set 13 of minor loops is designated the main storage area. The minor loops are shown as closed, curved lines in FIG. 1. A major path is associated with each end of the minor loops as can be seen in the figure. One major path 15 is operative during a read operation to move information to an expansion detector represented by triangle 16.

A second set 17 of minor loops is designated the auxiliary loop area herein and includes four auxiliary loops, designated $AL_1$, $AL_2$, $AL_3$, and $AL_4$, as shown for the illustrative memory. It will be seen that the auxiliary loops are operative to add data into the data stream from a selected address in the main storage area at positions of defective loops in that store. A major path 20 is associated with the top ends of loops $Al_1$ — $AL_4$ as viewed in FIG. 1 for movement of data to expansion detector 16 in synchronism with data moved from the main storage area. Operation of the main storage area loops and the auxiliary loops is consistent with familiar major-minor memory organization. That is to say, selection of an address results in the transfer of data from a selected slot corresponding to positions in both sets of loops. The transferred data proceeds synchronously along the major paths to the detector. Any defective loop in the main storage area leads to a hole in the data stream and the auxiliary loops are designed to fill the hole (or holes) with the appropriate bit (or bits). We will consider first the manner in which the auxiliary loops add the proper data to the data stream during a read operation and the implementation for that operation. We will then consider a write operation in which data are stored in a main storage area having defective loops as well as in the auxiliary loops so that fault-handling read operations can occur.

All the minor loops are coupled by a replicate conductor 25 in the illustrative memory. Conductor 25 is connected between a replicate pulse source 26 and ground. The conductor, when pulsed, is operative to produce in the major paths the image of the data in the stages of the minor loops coupled by the replicate conductor. Replicate implementations and the operations thereof are now familiar in the art and are not discussed further herein. But the form of the replicate implementation operative on the auxiliary loops is such as to serve an additional function. The implementation, specifically, functions as an idle register into which data from the auxiliary loops are stored and idled as other data in the memory move in response to in-plane field reorientations. A source of the in-plane field is represented by block 30 in FIG. 1.

Figure 2:
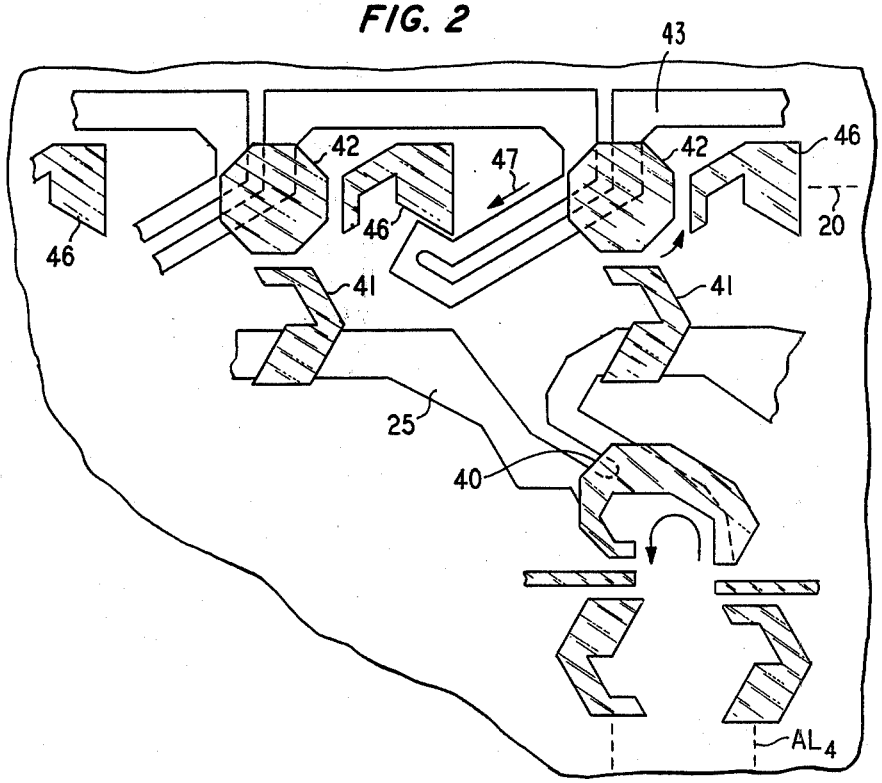

FIG. 2 shows an enlarged top view of electrical conductor and permalloy patterns which define the idle register associated with the auxiliary minor loops. Specifically, asymmetric chevron elements are shown for a portion of the accessing path 20 and a representative auxiliary loop $AL_4$. The elements are designed for bubble movement counterclockwise in the minor loops and from right to left in path 20. Selective movement of data from the auxiliary loop (or any minor loop) into an accessing path by replication occurs at a position designated 40 in FIG. 2 for the representative loop and occurs in response to a pulse on conductor 25. The resultant image information moves to elements 41 and from there into the associated accessing path.

The elements of the accessing path 20 have geometries to permit a selected one of two operations, bubble propagation or idle. Note particularly that elements 41 are closely associated with octagon-shaped permalloy elements 42. Such an element is adapted to recirculate a bubble about its periphery in the manner shown in A. J. Perneski, U.S. Pat. No. 3,555,527 issued Jan. 12, 1971. Recirculation occurs in the absence of a pulse applied to a conductor 43 by an idle control circuit 44 of FIG. 1. The octagon elements, on the other hand, are adapted to transfer a bubble to adjacent asymmetric chevron elements 46, in response to a pulse on conductor 43, along a path indicated by arrow 47 in FIG. 2.

The positions in the data stream, moving to detector 16, which will be occupied by data from the auxiliary loops, is determined by the idle control circuit.

Figure 3:
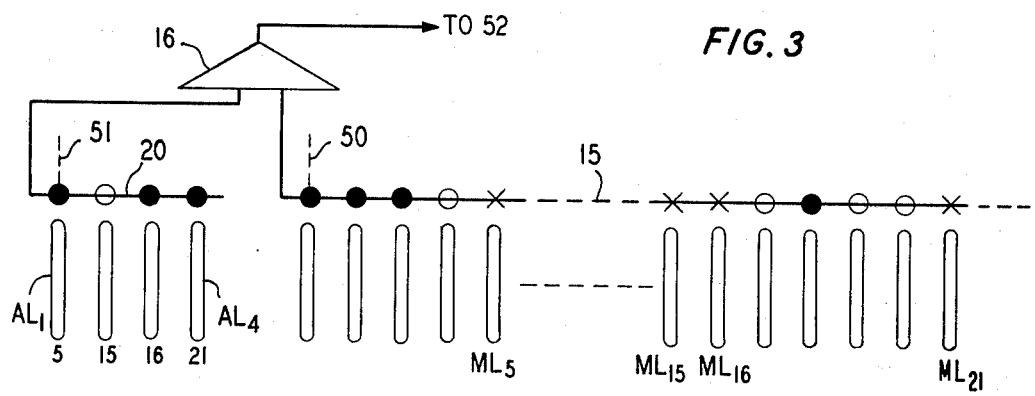

The operation of the idle register is most easily understood by way of example. FIG. 3 shows a memory in which minor loops $ML_5$, $ML_{15}$, $ML_{16}$, and $ML_{21}$ are defective or characterized by below-standard operating margins and information ordinarily stored in those loops is stored in the auxiliary loops as indicated by the minor loop subscript designations there. We will return hereinafter to alternative write operations in which storage in the necessary manner is achieved. For the moment, we will assume that storage as shown has been carried out and we will examine how a data stream is reconstituted during a read operation. The numbers of stages in the accessing paths 15 and 20 between points 50 and 51 and the detector stage are identical and herein assumed, arbitrarily, to be thirty stages. Thus, in thirty cycles of the in-plane field, the bit (bubble) shown at 50 is moved to the detector for applying an output to utilization circuit 52 of FIG. 1. Clearly, if the bit (bubble) at 51 is allowed to advance, it would arrive at the detector simultaneously with the bit from position 50. This coincidence of arrivals is avoided because the bits in the idle register normally merely recirculate as the in-plane field cycles to advance all other information in the memory.

Of course, eight cycles after the arrival of a bit from position 50, the data normally assigned to the defective loop $ML_5$ would arrive at the detector (adjacent minor loops being associated with alternate stages of the major path). Since data from this loop is absent in the associated time slot, the first bit from loop $AL_1$ is substituted for that data. That is to say, idle control circuit 44 applies a pulse to conductor 43 for causing the transfer of data in the idle register of FIG. 2 from the octagons 42 to the next adjacent asymmetric chevron elements 46. This transfer occurs at a time to cause arrival of that bit at the detector stage to substitute for the absent bit from loop $ML_5$. A next rotation of the in-plane field, specifically, finds the bits from loops $AL_2$, $AL_3$, and $AL_4$ on the peripheries of octagons. But, no octagon is present for the bit from position 51. Instead, the bit from position 51 is free of the idle register and advances along accessing path 20 in synchronism with the information gap related to loop $ML_5$ in response to later cycles of the in-plane field. The remaining bits in the idle register, of course, merely recirculate. Twenty, thirty-two and forty-two cycles later, circuit 44 pulses conductor 43. In each instance, data in the idle register step two stages to the left as viewed in FIG. 3 and the leftmost bit is freed for movement along path 20. Thus, the occurrence of a pulse in conductor 43 corresponds to the position in the data stream in path 15 destined to be occupied by data from the auxiliary loops.

We will now consider the control of the pulses on conductor 43 during a read operation and alternate write implementations resulting in the storage of data in a form consistent with that control. In one specific embodiment, circuit 44 includes a read-only memory (ROM) organized 128 words by 1 bit/word. Such a memory is capable of providing 128 discrete outputs adapted to apply a pulse selectively to conductor 43. Thus, for a 128 bit data stream, such a ROM is capable of controlling the pulse sequence for proper operation of the auxiliary memory area herein.

In the illustrative memory, the write operation takes place at the opposite ends of the minor loops from those at which the read operation occurs. That is to say, first and second write accessing paths 60 and 61 are associated with the main and auxiliary storage areas, respectively, as shown in FIG. 1. Generators 62 and 63 couple the accessing paths and are adapted, individually, to generate bubbles controllably therein in response to signals from an input pulse source represented by block 64 in FIG. 1. Major path 61 comprises an idle register similar to that shown in FIG. 2.

Functionally, the idle register of path 61 operates in a manner similar to that of FIG. 2 also. Input pulse source 64 pulses generator 62 to provide a data stream in accessing path 60 under the control of control circuit 68 of FIG. 1. But, the information destined for minor loops ML$_5$, ML$_{15}$, ML$_{16}$, and ML$_{21}$ is to be stored in the auxiliary loops. Thus, the pulse (or no pulse) corresponding to each of those loops is applied only to generator 63.

The idle register is operative to store each bit applied to generator 63, to recirculate each bit so stored, and to advance the bits to the next recirculating position on the occurrence of the next consecutive bit. As is the case with the idle register of path 20, the idle register of path 61 has an associated conductor 71 and a "write" idle control circuit represented by block 72 as shown in FIG. 1.

Figure 4:
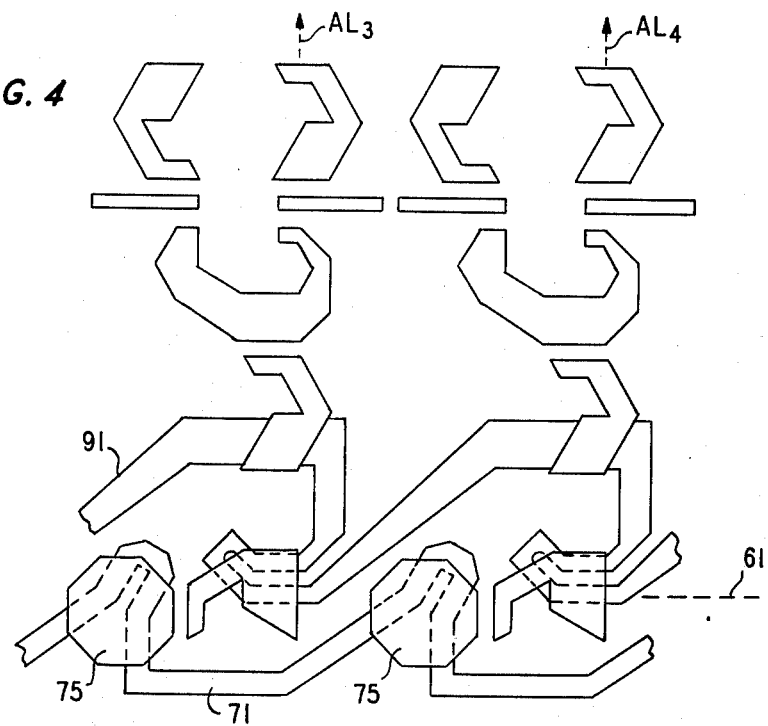

Consider FIG. 4 for the case where defective loops ML$_5$, ML$_{15}$, ML$_{16}$, and ML$_{21}$ are to be replaced by the auxiliary loops. As in FIG. 2, FIG. 4 shows the conductor and permalloy patterns for an idle register. In this instance, data destined for the defective loops are stored by signals applied to generator 63 by source 64. Specifically, in the data stream generated by generator 62, a gap occurs in the position for the bit destined for loop ML$_5$. During this gap, a signal is applied to generator 63 for storing a bubble (or no bubble) at the octagon 75 corresponding to minor loop AL$_4$ (see FIG. 4). The activation of generator 63 is under the control of control circuit 68. Control circuit 68 synchronously signals the write idle-control circuit 72 to pulse conductor 71 to advance, to the left as viewed in FIG. 1, any bits previously stored in idle register of path 61. The operation, in response to a pulse on conductor 71, is identical to that described hereinbefore in response to a pulse on conductor 43 of FIG. 1.

Since no prior information occupied the idle register when the bit corresponding to minor loop ML$_5$ is stored, no movement occurs in response to the pulse on conductor 71 in the illustrative operation. But, in the next instance where a gap occurs in the data stream corresponding to minor loop ML$_{15}$, source 64 signals generator 63 and circuit 72 pulses conductor 71. The bit previously stored moves to the octagon for loop AL$_3$ and the bit corresponding to minor loop ML$_{15}$ now occupies the octagon corresponding to loop AL$_4$. In this manner, data for defective loops ML$_{16}$ and ML$_{21}$ are also stored consecutively at the octagon for auxiliary loop AL$_4$ as previously stored data are moved to the left in the idle register. When the last bit destined for loop ML$_N$ is stored in accessing channel 60, the entire new word is stored with omitted data in the data stream in channel 60 occurring in the idle register of path 61 in the form required for a read operation as described hereinbefore. At this juncture, transfer pulse source 90 of FIG. 1 pulses transfer conductor 91 for transferring data from channels 60 and 61 into the auxiliary loops and minor loops. The transfer pulse occurs at a time to ensure transfer of data into the proper address under the control of control circuit 68.

A memory of the type shown in FIG. 1 can be realized with generators 62 and 63 connected electrically in series. In such an embodiment, consecutive input signals to the generators, during a write operation, result in the generation of a data stream, in its entirety, at each of the generators. Since it is intended to store less than the entire data stream at each generator, an implementation is provided, for example, at generator 62 to eliminate those bits of the data stream which correspond to faulty loops and an implementation is provided at generator 63 to eliminate all the bits of the data stream except for those corresponding to faulty loops. A simple implementation for realizing such an operation would be for all bits generated, for example, at 63 to move normally along a path to an annihilator except when a pulse occurs to transfer a bit to the idle register.

Figure 5:
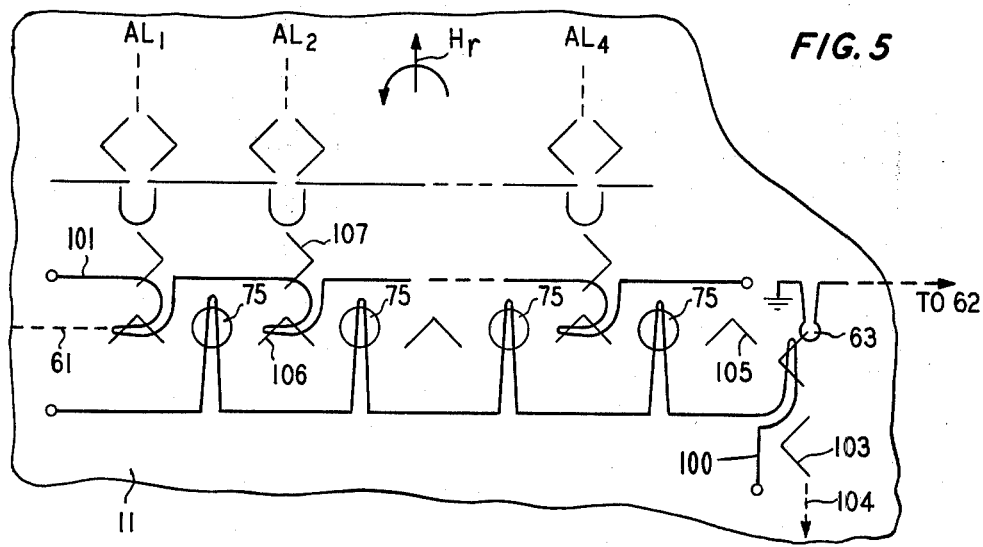

FIG. 5 shows one such implementation where a write operation is realized with generator 62 and 63 connected electrically in series. The figure shows, specifically, an enlarged schematic of the permalloy and electrical conductor pattern for a write-idle register for such an implementation. The channel elements are represented as chevron symbols and the "octagon"-shaped elements of the previous embodiment are represented as circles (an alternative form). Note that the circles in this embodiment are in positions between the auxiliary loops, rather than in positions corresponding to the auxiliary loops as shown in FIG. 2. This placement is primarily because transfer from an octagon is not readily implemented.

Both an idle control conductor like 71 of FIG. 1 and a transfer conductor like 91 in FIG. 1 are present in this embodiment. These conductors are designated 100 and 101 in FIG. 5. Conductor 101 can be seen to couple layer 11 at a chevron element 103 which defines the beginning of a path 104. The data stream generated at 63 normally moves downward as viewed along path 104 as in plane field $H_r$ reorients counterclockwise as indicated by the arrows in the figure. A pulse on conductor 101, on the other hand, causes the transfer of a bit to chevron-shaped element 105. The bit moves to the next adjacent circle to the left as viewed and recirculates thereabout in response to reorientations of the in-plane field. Generators 62 and 63 are activated during alternative cycles of the in-plane field. Thus, when a bit is generated, a previously stored bit is at a circle. Conductor 101 can be seen to couple each circle and is operative, when pulsed, to terminate recirculation and to cause recirculating bits to move to the left each time a new bit is to be stored in the idle register.

When all bits for a selected address are stored, conductor 101 is pulsed for moving recirculating bits to the next adjacent chevron elements to the left as viewed. Then, conductor 100 is pulsed to transfer the bits to the associated auxiliary loops. The transfer pulse occurs when the in-plane field is directed upward as indicated by arrow $H_r$ in FIG. 5. The bit, in this instance, is at the apex of chevron element 106 of, for example, loop AL$_2$. The transfer pulse moves the bit to the bottom end of element 107 as the in-plane field reorients downward. Further reorientations of the in-plane field recirculate the bits counterclockwise in the minor loops. The data for a selected address are now stored in the main memory area with data corresponding to faulty loops stored in the auxiliary loops in a form consistent with that employed during a read operation as described hereinbefore.

Magnetic bubbles are maintained at a nominal operating diameter by a bias field directed antiparallel to the magnetization of a bubble as is well known. A source of such a bias field is represented in FIG. 1 by block 110.

What has been described is considered merely illustrative of the principles of this invention. Therefore, various modifications thereof may be devised by those skilled in the art in accordance with those principles within the spirit and scope of this invention as encompassed by the following claims.

What is claimed is:

1. A magnetic memory comprising a layer of material in which single wall domains can be moved, a plurality of elements coupled to said layer for defining therein a plurality of closed-loop paths in which domain patterns are recirculated synchronously through first positions responsive to a cyclically varying magnetic field, said elements also defining a sequential accessing means and means for selectively moving domain patterns from said first positions to said sequential accessing means, said accessing means including a domain detector, said plurality of paths being organized into a main set and an auxiliary set, said memory also including means for controllably changing the positions in said sequential accessing means of the domain pattern from said auxiliary set with respect to that of said main set.

2. A magnetic memory in accordance with claim 1 wherein said magnetic elements comprise high permeability permalloy elements and are responsive to a magnetic field rotating in the plane of said layer.

3. A magnetic memory in accordance with claim 2 wherein said accessing means comprises first and second accessing paths for moving domain patterns from first positions in said main and said auxiliary sets respectively.

4. A magnetic memory in accordance with claim 3 wherein said second accessing path is adapted to controllably idle the domain pattern therein for changing the position thereof with respect to the pattern in said first accessing path.

5. A magnetic memory in accordance with claim 4 also including means for storing patterns of domains selectively in said main and auxiliary sets.

6. A magnetic memory in accordance with claim 5 wherein said means for storing comprises sequential accessing means for moving domains from a generator to the loops of one of said main and auxiliary sets.

7. A magnetic memory in accordance with claim 6 wherein said sequential accessing means comprises first and second accessing paths for moving domains from first and second generators to the loops of said main and auxiliary sets respectively.

8. A magnetic memory in accordance with claim 7 wherein said first and second generators are controlled independently.

9. A magnetic memory in accordance with claim 7 wherein said first and second generators are connected electrically in series.

10. A magnetic memory in accordance with claim 9 wherein said second accessing channel comprises an idle register, said memory also including a first path, said path being adapted to normally move domains from said second generator to an annihilator, and means for selectively transferring domains from said first path to said idle register.

11. A magnetic bubble memory including a layer of material in which magnetic bubbles can be moved, means for defining in said layer first and second sets of paths for recirculating bubble patterns through first positions therein in response to a magnetic field rotating in the plane of said layer, said means being adapted further to define first and second accessing paths for moving bubble patterns selectively from said first positions to a bubble detector synchronously, and means for selectively idling the bubble pattern in said first accessing path in a manner to alter the relationship between the bubble patterns in said first and second accessing paths.

12. A magnetic memory comprising a layer of material in which single wall domains can be moved, means for defining first and second sets of closed loops for recirculating domains thereabout in response to a magnetic field reorienting in the plane of said layer, said means being adapted to define first and second accessing paths for moving domains from first and second domain generators, respectively, to said first and second sets, said second accessing path comprising means for selectively idling domains therein for changing the positions of domains therein with respect to the positions of domains in said first accessing path.

13. A magnetic memory in accordance with claim 12 also comprising a first path leading to an annihilator, said second generator being adapted to generate domains in said first path for movement to said annihilator, and means for selectively transferring domains from said first path to said second accessing path.

14. A magnetic memory comprising a layer of material in which single wall domains can be moved and a plurality of elements for defining an idle register therein, alternate ones of said elements being adapted to recirculate domains thereabout in response to a magnetic field rotating in the plane of said layer, and an electrical conductor coupled to said layer at said alternate elements for selectively moving circulating domains to next consecutive elements.

15. A magnetic memory in accordance with claim 14 wherein the remaining ones of said plurality of elements are operative responsive to a cycle of said in-plane field for moving a domain from one of said alternate elements to a next said alternate element.

16. A magnetic memory in accordance with claim 15 wherein said elements are also adapted to define a plurality of closed loop paths in said layer, each of said closed loop paths including a first position closely spaced with respect to an associated one of said remaining elements, and means for selectively moving domains from said remaining elements to said first positions.

* * * * *